(12) United States Patent
Kang et al.

(10) Patent No.: US 12,324,281 B2
(45) Date of Patent: Jun. 3, 2025

(54) STRETCHABLE DEVICE AND ELECTRONIC DEVICE

(71) Applicant: Samsung Electronics Co., Ltd., Suwon-si (KR)

(72) Inventors: Hyun Bum Kang, Yongin-si (KR); Gae Hwang Lee, Seongnam-si (KR); Yeongjun Lee, Seongnam-si (KR); Youngjun Yun, Seongnam-si (KR); Jong Won Chung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 474 days.

(21) Appl. No.: 17/702,125

(22) Filed: Mar. 23, 2022

(65) Prior Publication Data

US 2022/0393067 A1  Dec. 8, 2022

(30) Foreign Application Priority Data

May 18, 2021 (KR) ........................ 10-2021-0064316

(51) Int. Cl.
| | |
|---|---|
| *H10H 20/831* | (2025.01) |
| *H01L 25/075* | (2006.01) |
| *H01L 25/16* | (2023.01) |
| *H10H 20/857* | (2025.01) |
| *H10K 39/10* | (2023.01) |

(52) U.S. Cl.
CPC ..... *H10H 20/8312* (2025.01); *H01L 25/0753* (2013.01); *H01L 25/167* (2013.01); *H10H 20/857* (2025.01); *H10K 39/10* (2023.02)

(58) Field of Classification Search
CPC . H01L 33/382; H01L 25/0753; H01L 25/167; H01L 33/62; H10K 39/10; H10K 50/11; H10K 77/111; H10K 59/10; H10K 59/131; H10K 2102/311; Y02E 10/549
See application file for complete search history.

(56) References Cited

U.S. PATENT DOCUMENTS

| 11,112,318 B2 | 9/2021 | Unyong et al. |
| 2012/0298200 A1 | 11/2012 | Niggemann et al. |
| 2014/0130850 A1 | 5/2014 | Nicolet et al. |
| 2016/0111670 A1 | 4/2016 | Lee et al. |

(Continued)

FOREIGN PATENT DOCUMENTS

| CN | 10-8550697 A | 9/2018 |
| CN | 10-8832000 A | 11/2018 |

(Continued)

OTHER PUBLICATIONS

Marija Mihailovich et al., "miR-17-92 fine-tunes MYC expression and function to ensure optimal B cell lymphoma growth" Nature Communications, Nov. 10, 2015, pp. 1-15.

(Continued)

*Primary Examiner* — Julia Slutsker
(74) *Attorney, Agent, or Firm* — Harness, Dickey & Pierce, P.L.C.

(57) ABSTRACT

A stretchable device includes a stretchable substrate, and a plurality of optoelectronic diodes on the stretchable substrate. At least one optoelectronic diode includes a first electrode and a second electrode, and an active layer between the first electrode and the second electrode. The active layer includes a first semiconductor, a second semiconductor having different electrical characteristics from the first semiconductor, and an insulating elastomer.

21 Claims, 7 Drawing Sheets

(56) References Cited

U.S. PATENT DOCUMENTS

| | | |
|---|---|---|
| 2020/0212304 A1 | 7/2020 | He et al. |
| 2021/0104685 A1 | 4/2021 | Lai et al. |
| 2021/0167309 A1 | 6/2021 | Baran et al. |

FOREIGN PATENT DOCUMENTS

| | | |
|---|---|---|
| CN | 10-8767118 B | 10/2019 |
| CN | 10-9273603 B | 6/2020 |
| CN | 2020-10551504 | 9/2020 |
| CN | 111635504 A | 9/2020 |
| CN | 112701225 A | 4/2021 |
| EP | 2544598 A1 | 1/2013 |
| JP | 2019-051321 A | 4/2019 |
| JP | 2021-508415 A | 3/2021 |
| KR | 2015-0126570 A | 11/2015 |
| KR | 10-2016-0002634 A | 1/2016 |
| KR | 10-1927463 B1 | 12/2018 |
| KR | 2019-0011431 A | 2/2019 |
| KR | 10-2046602 B1 | 11/2019 |
| KR | 10-2099184 B1 | 4/2020 |
| KR | 10-2128237 B1 | 7/2020 |
| KR | 10-2130593 B1 | 7/2020 |
| WO | WO-2011/112931 A1 | 9/2011 |

OTHER PUBLICATIONS

Extended European Search Report dated Oct. 24, 2022 for corresponding European Application No. 22168704.9.

Shanshan Chen et al., "Highly Flexible and Efficient All-Polymer Solar Cells with High-Viscosity Processing Polymer Additive toward Potential of Stretchable Devices", Zuschriften, Angewandte Chemie, Oct. 1, 2018, vol. 130, No. 40, pp. 13461-13466, DOI: 10.1002/ange.201807513.

Shanshan Chen et al., "A Synergetic Effect of Molecular Weight and Fluorine in All-Polymer Solar Cells with Enhanced Performance", Advanced Functional Materials, Jan. 12, 2017, vol. 27, No. 2, 1603564, 10 pages.

Shanshan Chen et al., "Supporting Information: Highly Flexible and Efficient All-Polymer Solar Cells with High-Viscosity Processing Polymer Additive toward Potential of Stretchable Devices", Angewandte Chemie, Oct. 1, 2018, pp. S1-S26.

Korean Office Action dated Apr. 24, 2025 for corresponding Korean Application No. 10-2021-0064316, and English-language translation thereof.

Shanshan Chen et al., "Highly Flexible and Efficient All-Polymer Solar Cells with High-Viscosity Processing Polymer Additive toward Potential of Stretchable Devices", Angew. Chem. Int. Ed., vol. 57, pp. 13277-13282, 2018.

STRETCHABLE DEVICE AND ELECTRONIC DEVICE

CROSS-REFERENCE TO RELATED APPLICATION

This application claims priority to and the benefit of Korean Patent Application No. 10-2021-0064316 filed in the Korean Intellectual Property Office on May 18, 2021, the entire contents of which are incorporated herein by reference.

BACKGROUND

1. Field

Stretchable devices and electronic devices are disclosed.

2. Description of the Related Art

Recently, research has been conducted on attachable devices that directly attach biological devices such as display devices or smart skin devices, soft robots, and biomedical devices to objects, skin, or clothes. Such an attachable device may respond flexibly according to the shape of an object or the movement of a living body, and stretchability that can be restored to its original state is required.

SUMMARY

For such stretchability, a device may be manufactured on a stretchable substrate. However, there is a limit for stretchability by stretching the stretchable substrate and wiring alone, and the device may be broken or damaged by stretching, and thus electrical characteristics may be deteriorated.

Some example embodiments provide a stretchable device capable of satisfying electrical and mechanical properties.

Some example embodiments provide an electronic device including the stretchable device.

According to some example embodiments, a stretchable device may include a stretchable substrate, and a plurality of optoelectronic diodes on the stretchable substrate, wherein each optoelectronic diode includes a first electrode and a second electrode, and an active layer between the first electrode and the second electrode and including a first semiconductor, a second semiconductor having different electrical characteristics from the first semiconductor, and an insulating elastomer.

At least one of the first semiconductor or the second semiconductor may be an organic semiconductor.

At least one of the first semiconductor or the second semiconductor may be a polymeric semiconductor.

The insulating elastomer may be a copolymer including at least one hard structural unit and at least one soft structural unit.

The hard structural unit may include a styrene structural unit, an olefin structural unit, a urethane structural unit, an ether structural unit, or any combination thereof.

The soft structural unit may include an ethylene structural unit, a propylene structural unit, a butylene structural unit, an isobutylene structural unit, a butadiene structural unit, an isoprene structural unit, or any combination thereof.

A weight ratio of the hard structural unit to the soft structural unit may about 0.01 to about 1.0.

The weight ratio of the hard structural unit to the soft structural unit may be about 0.01 to about 0.5.

The insulating elastomer may include styrene-ethylene-butylene-styrene (SEBS), styrene-ethylene-propylene-styrene (SEPS), styrene-butadiene-styrene (SBS), styrene-isobutylene-styrene (SIBS), or any combination thereof.

The insulating elastomer may be included in the active layer in an amount that is greater than or equal to an amount of the first semiconductor or the second semiconductor in the active layer.

The insulating elastomer may be included in the active layer in an amount of about 30 wt % to about 75 wt % based on a total content of the first semiconductor, the second semiconductor, and the insulating elastomer in the active layer.

The active layer may include a mixture of the first semiconductor, the second semiconductor, and the insulating elastomer.

At least one of the first electrode or the second electrode may be a stretchable electrode.

The stretchable device may further include a connection wiring electrically connecting adjacent optoelectronic diodes of the plurality of optoelectronic diodes, and the connection wiring may include a stretchable wiring.

At least one first optoelectronic diode of the plurality of optoelectronic diodes may include a photosensor configured to absorb light and convert the absorbed light into an electrical signal, and the active layer of the at least one first optoelectronic diode may be a photoelectric conversion layer.

Each semiconductor of the first semiconductor and the second semiconductor in the photoelectric conversion layer may be a p-type semiconductor or an n-type semiconductor.

At least one second optoelectronic diode of the plurality of optoelectronic diodes may be a light emitting diode that is configured to emit light, and the active layer of the at least one second optoelectronic diode may be a light emitting layer.

Each semiconductor of the first semiconductor and the second semiconductor in the light emitting layer may be a host material or a dopant material.

The plurality of optoelectronic diodes may include a plurality of first optoelectronic diodes and a plurality of second optoelectronic diodes. The plurality of first optoelectronic diodes may be photosensors that are each configured to absorb light and convert the absorbed light into an electrical signal. The plurality of second optoelectronic diodes may be light emitting diodes that are configured to emit light, and the photosensors and the light emitting diodes may be arranged along an in-plane direction of the stretchable substrate to establish an array of optoelectronic diodes.

The stretchable device may be a bio signal sensor.

According to some example embodiments, a stretchable device may include a stretchable substrate and an optoelectronic diode on the stretchable substrate. The optoelectronic diode may include a first electrode and a second electrode, and an active layer between the first electrode and the second electrode. The active layer may include a first semiconductor, a second semiconductor having different electrical characteristics from the first semiconductor, and an insulating elastomer.

The optoelectronic diode may be a photosensor or a light emitting diode.

The stretchable device may further include: a first array of optoelectronic diodes that are arranged along an in-plane direction of the stretchable substrate, the first array of optoelectronic diodes including the optoelectronic diodes. The first array of optoelectronic diodes may be exclusively photosensors or light emitting diodes.

The stretchable device may further include a second array of optoelectronic diodes that are arranged along the in-plane direction of the stretchable substrate. The first array of optoelectronic diodes may be exclusively photosensors and the second array of optoelectronic diodes may be exclusively light emitting diodes.

The first semiconductor, the second semiconductor, and the insulating elastomer may be included in the active layer in a weight ratio of 1.3:1.0:1.15 to 1.3:1.0:3.5.

An electronic device may include the stretchable device.

According to some example embodiments, an electronic device including the stretchable device is provided.

Mechanical properties may be satisfied without significantly lowering the electrical characteristics of the stretchable device.

DETAILED DESCRIPTION

Figure 1:
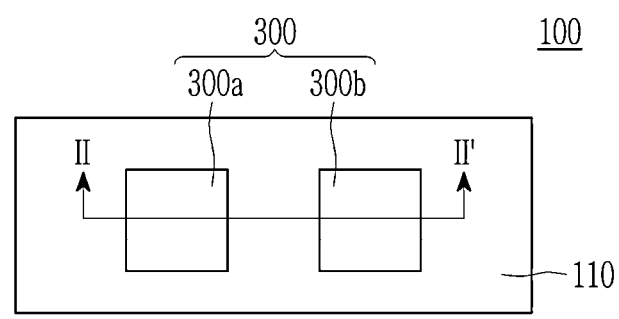
FIG. 1 is a plan view schematically showing a stretchable device according to some example embodiments.

Hereinafter, example embodiments are described in detail so that those skilled in the art can easily implement them. However, the actual applied structure may be implemented in various different forms and is not limited to the implementations described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

As used herein, "substantially" and "about" includes an approximate range taking into account variations and errors within a normal range, for example, about ±5%, ±4%, ±3%, ±2%, or ±1%.

Hereinafter, the term "combination" includes a mixture, or a stacked structure of two or more.

Hereinafter, a device, layer, element, region, or the like that is described as being "stretchable" will be understood to be elastic and/or configured to be elastic, such that the device, layer, element, region, or the like is configured to be elastically deformed (e.g., stretched, compressed, subjected to strain, etc.) such that the device, layer, element, region, or the like is configured to resume its same original shape after being deformed. For example, a stretchable device, layer, element, region, or the like as described herein may be capable of being elastically deformed such that the stretchable device, layer, element, region, or the like can resume, and does resume, an original shape after being stretched or compressed.

Hereinafter, a device, layer, element, region, or the like that is described as being "non-stretchable" or "rigid" will be understood to be non-elastic and/or not configured to be elastic, such that the device, layer, element, region, or the like is configured to not be elastically deformed (e.g., stretched, compressed, subjected to strain, etc.) such that the device, layer, element, region, or the like is configured to not resume its same original shape after being deformed. For example, a non-stretchable device, layer, element, region, or the like as described herein may not be able to be elastically deformed due to applied strain such that the non-stretchable device, layer, element, region, or the like cannot, and does not, resume an original shape after being stretched or compressed.

Hereinafter, a stretchable device according to some example embodiments is described with reference to the drawings.

Figure 2:
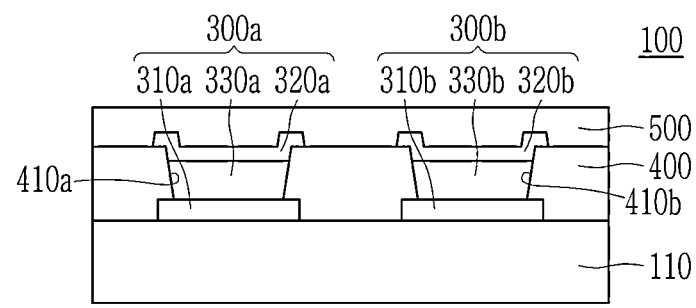
FIG. 2 is a cross-sectional view taken along the line II-II' of the stretchable device of FIG. 1.

FIG. 1 is a plan view schematically showing a stretchable device according to some example embodiments, and FIG. 2 is a cross-sectional view taken along the line II-II' of the stretchable device of FIG. 1.

Referring to FIGS. 1 and 2, the stretchable device 100 according to some example embodiments includes a substrate 110, a plurality of optoelectronic diodes 300 on the substrate 110, and optionally a pixel defining layer 400, and an encapsulation layer 500.

The substrate 110 may be a stretchable substrate that can be stretched in a particular (or, alternatively, predetermined) direction and can be restored again. The stretchable substrate may flexibly respond to external forces or external movements such as twisting, pressing, and pulling in a particular (or, alternatively, predetermined) direction. The substrate 110 may include a stretchable material and the stretchable material may include an organic elastomer, an organic-inorganic elastomer, an inorganic elastomer-like material, or any combination thereof. The organic elastomer or the organic-inorganic elastomer may be, for example, substituted or unsubstituted polyorganosiloxane such as polydimethylsiloxane, an elastomer including substituted or unsubstituted butadiene moiety such as styrene-ethylene-butylene-styrene, an elastomer including a urethane moiety, an elastomer including an acrylic moiety, an elastomer including an olefin moiety, or any combination thereof, but is not limited thereto. The inorganic elastomer-like material may include an elastic ceramic, solid metal (e.g., steel), liquid metal, or any combination thereof, but is not limited thereto. The substrate 110 may have one layer or two or more layers made of different materials.

A plurality of optoelectronic diodes 300 are disposed on the substrate 110. The plurality of optoelectronic diodes 300 may be the same or different from each other, and each optoelectronic diode 300 is independently a photosensor configured to absorb light of a particular (or, alternatively, predetermined) wavelength spectrum and convert the absorbed light into an electrical signal, or a light emitting diode configured to emit light of a particular (or, alternatively, predetermined) wavelength spectrum. Although the drawing illustrates a structure in which two optoelectronic diodes 300 are disposed on the substrate 110, the present inventive concepts are not limited thereto, and three or more optoelectronic diodes 300 may be included.

For example, at least a portion of the plurality of optoelectronic diodes 300 may be a photosensor. For example, at least a portion of the plurality of optoelectronic diodes 300 may be light emitting diodes. For example, a portion of the plurality of optoelectronic diodes 300 may be a photosensor, and a portion of the plurality of optoelectronic diodes 300 may be a light emitting diode.

For example, the plurality of optoelectronic diodes 300 include a first optoelectronic diode 300a and a second optoelectronic diode 300b adjacent to each other. The first optoelectronic diode 300a may be, for example, a photosensor and the second optoelectronic diode 300b may be a light emitting diode.

The first and second optoelectronic diodes 300a and 300b include first electrodes 310a and 310b, second electrodes 320a and 320b, and active layers 330a and 330b, respectively.

One of the first electrodes 310a and 310b or the second electrodes 320a and 320b may be an anode and the other is a cathode. For example, the first electrodes 310a and 310b may be anodes and the second electrodes 320a and 320b may be cathodes. For example, the first electrodes 310a and 310b may be cathodes and the second electrodes 320a and 320b may be anodes.

At least one of the first electrodes 310a or 310b may be a light-transmitting electrode. At least one of the second electrodes 320a or 320b may be a light-transmitting electrode. The light-transmitting electrode may be configured to transmit light, and may have for example, light transmittance of greater than or equal to about 70%, greater than or equal to about 75%, greater than or equal to about 80%, greater than or equal to about 85%, greater than or equal to about 90%, greater than or equal to about 95%, greater than or equal to about 97%, greater than or equal to about 98%, or greater than or equal to about 99%, less than or equal to 100%, less than or equal to about 99.9%, less than or equal to about 99.5%, or any combination thereof. The light transmitting electrode may include, for example, at least one of an oxide conductor, a carbon conductor, a metal nano-structure, or a metal thin film. The oxide conductors may include, for example, one or more of indium tin oxide (ITO), indium zinc oxide (IZO), zinc tin oxide (ZTO), aluminum tin oxide (ATO), and aluminum zinc oxide (AZO), the carbon conductor may include one or more of graphene and carbon nanostructures, the metal nanostructure may include metal nanowires such as silver nanowires, and the metal thin film may be a very thin film including aluminum (Al), magnesium (Mg), silver (Ag), gold (Au), magnesium-silver (Mg—Ag), magnesium-aluminum (Mg—Al), an alloy thereof, or a combination thereof.

Any one of the first electrodes 310a or 310b may be a reflective electrode. Any one of the second electrodes 320a or 320b may be a reflective electrode. The reflective electrode may be configured to reflect light, and may have a reflectance of greater than or equal to about 50%, greater than or equal to about 75%, greater than or equal to about 80%, greater than or equal to about 85%, greater than or equal to about 90%, greater than or equal to about 95%, greater than or equal to about 97%, greater than or equal to about 98%, or greater than or equal to about 99%, less than or equal to 100%, less than or equal to about 99.9%, less than or equal to about 99.5%, or any combination thereof. The reflective electrode may include an optically opaque material including a metal, a metal nitride, or a combination thereof, for example silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto. The reflective electrode may be formed of a reflective layer or may have a stacked structure of a reflective layer/transmissive layer or a transmissive layer/reflective layer/transmissive layer, and the reflective layer may be one layer or two or more layers.

For example, the first electrodes 310a and 310b may be light-transmitting electrodes, and the second electrodes 320a and 320b may be reflective electrodes.

At least one of the first electrodes 310a or 310b may be a stretchable electrode. At least one of the second electrodes 320a or 320b may be a stretchable electrode. The stretchable electrodes may include, for example, a stretchable conductor, or may have a stretchable shape such as a wavy, wrinkled, pop-up, or non-planar mesh shape. Each electrode of the first electrodes 310a and 310b and the second electrodes 320a and 320b may comprise, for example, a metal, a conductive oxide, a conductive polymer, or a combination thereof, for example, gold (Au), copper (Cu), nickel (Ni), aluminum (Al), molybdenum (Mo), chromium (Cr), tantalum (Ta), titanium (Ti), an alloy thereof, zinc oxide, indium oxide, tin oxide, indium tin oxide (ITO), indium zinc oxide (IZO), or fluorine-doped tin oxide, poly(3,4-ethylenedioxythiophene) (PEDOT), poly(3,4-ethylenedioxythiophene) polystyrene sulfonate (PEDOT:PSS), or a combination thereof, but are not limited thereto. The stretched electrode may have, for example, a plurality of microcracks. In general, microcracks are microscopic cracks in a material. Microcracks are small linear or non-linear cracks that take the form of planar ellipses, typically with dimensions of about 1 micrometer to hundreds of micrometers. Since the plurality of microcracks are separated from each other like small holes, they may be expanded along the stretching direction during stretching while maintaining the electrical movement path in the stretchable electrode, thereby providing flexibility to the stretchable electrode.

The active layers 330a and 330b may be between the first electrodes 310a and 310b and the second electrodes 320a and 320b, and may be a photoelectric conversion layer configured to absorb light and convert the absorbed light into an electrical signal, or a light emitting layer configured to emit light from electrical energy.

The active layers 330a and 330b include a first semiconductor, a second semiconductor, and an elastomer. A photoelectric conversion layer and/or a light emitting layer as described herein may include the first semiconductor, second semiconductor, and elastomer according to any of the example embodiments. The second semiconductor may have different electrical characteristics from the first semiconductor, and energy transfer or charge transfer may occur from the first semiconductor to the second semiconductor or vice versa due to these different electrical characteristics. At least one of the first semiconductor or the second semiconductor may be an organic semiconductor, and for example, each of the first semiconductor and the second semiconductor may be an organic semiconductor. For example, at least one of the first semiconductor or the second semiconductor may be a polymeric semiconductor having a conjugated structure. For example, each of the first semiconductor and the second semiconductor may be a polymeric semiconductor, or any one of the first semiconductor and the second semiconductor may be a polymeric semiconductor and the other may be a low molecular weight semiconductor. The elastomer may be an insulating elastomer, and may be mixed with the first semiconductor and the second semiconductor in the active layers 330a and 330b. As described herein, the elastomer according to any of the example embodiments may be an insulating elastomer. An insulating elastomer, as described herein, may have a composition of any of the elastomers according to any of the example embodiments as described herein.

For example, the active layer 330a of the first optoelectronic diode 300a may be a photoelectronic conversion layer. The active layer 330a of the first optoelectronic diode 300a may be configured to absorb at least one of a blue wavelength spectrum, a green wavelength spectrum, a red wavelength spectrum, an infrared wavelength spectrum, or an ultraviolet wavelength spectrum and may be configured to convert the absorbed light into an electrical signal. Herein, maximum absorption wavelengths ($\lambda_{max,A}$) of the blue wavelength spectrum, green wavelength spectrum, red wavelength spectrum, infrared wavelength spectrum, and ultraviolet (UV) wavelength spectrum may belong to each wavelength range of greater than or equal to about 380 nm and less than about 500 nm, about 500 nm to about 600 nm, greater than about 600 nm and less than or equal to about 700 nm, greater than about 700 nm and less than or equal to about 3000 nm, and less than about 380 nm. For example, the active layer 330a of the first optoelectronic diode 300a may have wavelength selectivity, and may be configured to selectively absorb any one light of a blue wavelength spectrum, a green wavelength spectrum, a red wavelength spectrum, an infrared wavelength spectrum, or an ultraviolet wavelength spectrum and convert the absorbed light into an electrical signal.

The active layer 330a of the first optoelectronic diode 300a may include the first semiconductor, the second semiconductor, and the elastomer as described above. One of the first semiconductor or the second semiconductor included in the active layer 330a may be a p-type semiconductor (electron donor) and the other may be an n-type semiconductor (electron acceptor), and the first semiconductor and the second semiconductor may form a pn junction. The active layer 330a may include at least one p-type semiconductor and at least one n-type semiconductor, generate excitons by receiving light from the outside, and then separate the generated excitons into holes and electrons. For example, the HOMO energy level of the p-type semiconductor may be about 4.7 eV to about 5.8 eV, and may be about 4.9 eV to about 5.6 eV or about 5.1 eV to about 5.4 eV within the above range. For example, the LUMO energy level of the n-type semiconductor may be about 3.4 eV to about 4.5 eV, and about 3.6 eV to about 4.3 eV or about 3.7 eV to about 4.1 eV within the above range. A difference between the HOMO energy level of the p-type semiconductor and the n-type semiconductor may be greater than or equal to about 0.1 eV, for example, about 0.1 eV to about 2.0 eV. A difference between the LUMO energy levels of the p-type semiconductor and the n-type semiconductor may be greater than or equal to about 0.1 eV, for example, about 0.1 eV to about 2.0 eV.

At least one of the first semiconductor or the second semiconductor included in the active layer 330a may be a light absorbing material configured to absorb light, and for example, at least one of the first semiconductor or the second semiconductor may be an organic light absorbing material. For example, at least one of the first semiconductor or the second semiconductor may be a polymeric light absorbing material. For example, each of the first semiconductor and the second semiconductor may be a polymeric light absorbing material, or any one of the first semiconductor or the second semiconductor may be a polymeric light absorbing material and the other may be a low molecular weight light absorbing material. For example, at least one of the first semiconductor or the second semiconductor may be a wavelength-selective light absorbing material configured to selectively absorb light of a particular (or, alternatively, predetermined) wavelength spectrum. For example, at least one of the first semiconductor or the second semiconductor may be a wavelength-selective organic light absorbing material. The first semiconductor and the second semiconductor may have a respective maximum absorption wavelength ($\lambda_{max,A}$) in the same or different wavelength regions.

For example, the first semiconductor may be a p-type semiconductor, for example, a p-type polymeric semiconductor including a structural unit represented by Chemical Formula 1.

[Chemical Formula 1]

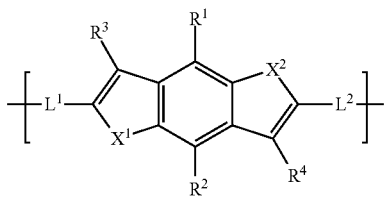

In Chemical Formula 1,
$X^1$ and $X^2$ may each independently be O, S, Se, or Te,
$L^1$ and $L^2$ may each independently be a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, or any combination thereof, and
$R^1$ to $R^4$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 heteroaryl group, a halogen, a cyano group, or any combination thereof.

For example, in Chemical Formula 1, $R^1$ and $R^2$ may each independently include a substituted or unsubstituted C3 to C30 heteroaryl group, or for example a substituted or unsubstituted C3 to C30 heteroaryl group including O, S, Se, or Te.

For example, in Chemical Formula 1, $R^1$ and $R^2$ may each independently include a C3 to C30 heteroaryl group substituted with a C1 to C30 alkyl group, or for example a C3 to C30 heteroaryl group substituted with a C1 to C30 alkyl group and including O, S, Se, or Te.

For example, in Chemical Formula 1, $L^1$ and $L^2$ may each independently include a single bond or a substituted or unsubstituted C3 to C30 heteroarylene group, or for example a single bond or a substituted or unsubstituted C3 to C30 heteroarylene group including O, S, Se, or Te.

For example, the second semiconductor may be an n-type semiconductor, and for example, an n-type polymeric semiconductor including a structural unit represented by Chemical Formula 2.

[Chemical Formula 2]

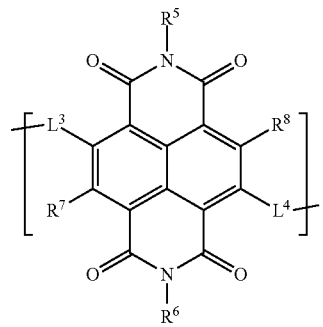

In Chemical Formula 2,
$L^3$ and $L^4$ may each independently be a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, or any combination thereof, and
$R^5$ to $R^8$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 heteroaryl group, a halogen, a cyano group, or any combination thereof.

For example, in Chemical Formula 2, $R^5$ and $R^6$ may each independently include a substituted or unsubstituted C1 to C30 alkyl group and for example $R^5$ and $R^6$ may each independently include a substituted or unsubstituted C3 to C30 branched alkyl group.

For example, in Chemical Formula 2, $L^3$ and $L^4$ may each independently include a single bond or a substituted or unsubstituted C3 to C30 heteroarylene group, or for example a single bond or a substituted or unsubstituted C3 to C30 heteroarylene group including O, S, Se, or Te.

For example, the second semiconductor may be an n-type semiconductor, and for example n-type low molecular weight semiconductor. The n-type low molecular weight semiconductor may be fullerene or a fullerene derivative or a non-fullerene compound. The fullerene derivative may include for example phenyl-C61-butyric acid methyl ester (PCBM), but is not limited thereto.

The first semiconductor and the second semiconductor may be included in the active layer 330a in a weight ratio of about 1:9 to about 9:1, and within the above range, about 2:8 to about 8:2, about 3:7 to about 7:3, about 4:6 to about 6:4, or about 5:5.

The elastomer included in the active layer 330a may be an insulating elastomer, and may be mixed with the first semiconductor and the second semiconductor in the active layer 330a. The elastomer may be mixed with the aforementioned first semiconductor and second semiconductor to impart stretchability to the active layer 330a, and may be distributed over the entire surface of the active layer 330a. For example, the elastomer may surround the first semiconductor and the second semiconductor, thereby preventing damage and/or breakage of the first semiconductor and the second semiconductor during stretching.

The elastomer may be an insulating elastic polymer, and thus may not have an electrical influence at the interface between the first semiconductor and the second semiconductor. In addition, the elastomer may have a surface tension in a range similar to the surface tension of the first semiconductor and the second semiconductor. For example, the surface tension of the elastomer may be about 0.5 times or more and less than about 2 times, about 0.6 times to about 1.8 times, about 0.7 times to about 1.6 times, or about 0.8 times to about 1.5 times relative to the surface tension of the first semiconductor and the second semiconductor, but is not limited thereto. Accordingly, the elastomer may reduce heterogeneity with the first semiconductor and the second semiconductor in the active layer 330a and increase miscibility.

For example, the elastomer may be a thermoplastic elastomer. The elastomer may be a polymer including a plurality of structural units that are the same or different from each other, and may be, for example, a copolymer including two or more different structural units. As an example, the elastomer may be a copolymer including at least one hard structural unit providing relatively hard physical properties and at least one soft structural unit providing relatively soft physical properties.

The hard structural unit may provide plastic properties such as, for example, high-temperature performance, thermoplastic processability, tensile strength and tear strength and the soft structural unit may provide low-temperature performance, hardness, flexibility, and elastomeric properties such as tension/compression. The elastomer may exhibit desired elastic properties by properly disposing the hard structural unit and the soft structural unit. The hard structural units and the soft structural units may be respectively alternately arranged or arranged in clusters or blocks in the elastomer.

The hard structural unit may include, for example, a styrene-containing structural unit, an olefin-containing structural unit, a urethane-containing structural unit, an ether-containing structural unit, or any combination thereof, but is not limited thereto. The soft structural unit may include, for example, an ethylene structural unit, a propylene structural unit, a butylene structural unit, an isobutylene structural unit, a butadiene structural unit, an isoprene structural unit, or any combination thereof, but is not limited thereto.

For example, the elastomer may be a styrene-containing polymer including a styrene structural unit as a hard structural unit and an ethylene structural unit, a propylene structural unit, a butylene structural unit, an isobutylene structural unit, a butadiene structural unit, an isoprene structural unit, or any combination thereof as a soft structural unit.

For example, the elastomer may include one selected from styrene-ethylene-butylene-styrene (SEBS), styrene-ethylene-propylene-styrene (SEPS), styrene-butadiene-styrene (SBS), styrene-isobutylene-styrene (SIBS), and any combination thereof, but is not limited thereto.

As described above, the elastomer may adjust an elastic modulus by properly disposing the hard structural unit and the soft structural unit. For example, as a weight ratio of the hard structural unit to the soft structural unit is higher, the active layer 330a may have a relatively higher elastic modulus, and likewise, as the weight ratio of the hard structural unit to the soft structural unit is lower, the active layer 330a may have a relatively lower elastic modulus.

For example, a weight ratio of the hard structural unit to the soft structural unit of the elastomer may be less than about 1, within the above range, less than or equal to about 0.9, less than or equal to about 0.8, less than or equal to about 0.7, less than or equal to about 0.6, less than or equal to about 0.5, less than or equal to about 0.4, or less than or equal to about 0.3, about 0.01 to about 1.0, about 0.01 to about 0.9, about 0.01 to about 0.8, about 0.01 to about 0.7, about 0.01 to about 0.6, about 0.01 to about 0.5, about 0.01 to about 0.4, or about 0.01 to about 0.3. Such an elastomer may have a relatively low elastic modulus, and thus the active layer 330a having a relatively high elongation rate may be implemented.

For example, the weight ratio of the hard structural unit to the soft structural unit of the elastomer may be greater than about 1, within the above range, greater than or equal to about 1.1, greater than or equal to about 1.2, greater than or equal to about 1.3, greater than or equal to about 1.4, greater than or equal to about 1.5, greater than or equal to about 1.7, greater than or equal to about 1.9, or greater than or equal to about 2.0, greater than about 1.0 and less than or equal to about 9.9, about 1.1 to about 9.9, about 1.2 to about 9.9, about 1.3 to about 9.9, about 1.4 to about 9.9, about 1.5 to about 9.9, about 1.7 to about 9.9, about 1.9 to about 9.9, or about 2.0 to about 9.9. Such an elastomer may have a relatively high elastic modulus, and thus the active layer 330a having a relatively low elongation rate may be implemented.

The elastomer may be included in an amount of greater than or equal to about 20 wt % in the active layer 330a, for example, within the above range, greater than or equal to about 25 wt %, greater than or equal to about 30 wt %, greater than or equal to about 33 wt %, greater than or equal to about 35 wt %, greater than or equal to about 40 wt %, or greater than or equal to about 45 wt %, within the above range, about 20 to about 80 wt %, about 20 to about 75 wt %, about 20 wt % to about 70 wt %, about 20 wt % to about 65 wt %, about 20 wt % to about 60 wt %, about 20 wt % to about 55 wt %, about 20 wt % to about 50 wt %, about 25 wt % to about 80 wt %, about 25 wt % to about 75 wt %, about 25 wt % to about 70 wt %, about 25 wt % to about 65 wt %, about 25 wt % to about 60 wt %, about 25 wt % to about 55 wt %, about 25 wt % to about 50 wt %, about 30 wt % to about 80 wt %, about 30 wt % to about 75 wt %, about 30 wt % to about 70 wt %, about 30 wt % to about 65 wt %, about 30 wt % to about 60 wt %, about 30 wt % to about 55 wt %, about 30 wt % to about 50 wt %, about 33 wt % to about 80 wt %, about 33 wt % to about 75 wt %, about 33 wt % to about 70 wt %, about 33 wt % to about 65 wt %, about 33 wt % to about 60 wt %, about 33 wt % to about 55 wt %, about 33 wt % to about 50 wt %, about 35 wt % to about 80 wt %, about 35 wt % to about 75 wt %, about 35 wt % to about 70 wt %, about 35 wt % to about 65 wt %, about 35 wt % to about 60 wt %, about 35 wt % to about 55 wt %, about 35 wt % to about 50 wt %, about 40 wt % to about 80 wt %, about 40 wt % to about 75 wt %, about 40 wt % to about 70 wt %, about 40 wt % to about 65 wt %, about 40 wt % to about 60 wt %, about 40 wt % to about 55 wt %, about 40 wt % to about 50 wt %, about 45 wt % to about 80 wt %, about 45 wt % to about 75 wt %, about 45 wt % to about 70 wt %, about 45 wt % to about 65 wt %, about 45 wt % to about 60 wt %, about 45 wt % to about 55 wt % or about 45 wt % to about 50 wt % based on the total content of the first semiconductor, the second semiconductor, and the elastomer in the active layer 330a. Since the elastomer is included in the above ranges, stretchability may be secured without greatly degrading the electrical characteristics of the active layer 330a.

As an example, the elastomer may be included in an amount of greater than or equal to the first semiconductor or the second semiconductor. For example, the elastomer may be included in the active layer 330a in an amount of about 100 parts by weight to about 300 parts by weight, within the above range, about 100 parts by weight to about 250 parts by weight, or about 100 parts by weight to about 200 parts by weight, based on 100 parts by weight of the first semiconductor or the second semiconductor in the active layer 330a.

For example, the elastic modulus of the active layer 330a may be similar to the elastic modulus of the substrate 110. For example, the elastic modulus of the active layer 330a may be about 0.5 times to about 100 times, and within the above range, about 0.5 times to about 80 times, about 0.5 times to about 60 times, about 0.5 times to about 50 times, or about 0.5 times to about 30 times the elastic modulus of the substrate 110, but is not limited thereto.

The elastic modulus of the active layer 330a may be, for example, about $10^2$ Pa to about $10^9$ Pa, within the above range, about $10^2$ Pa to about $10^8$ Pa, about $10^2$ Pa to about $10^7$ Pa, or about $10^2$ Pa to about $10^6$ Pa, but is not limited thereto. Herein, the elastic modulus may be Young's modulus.

The first optoelectronic diode 300a may further include an auxiliary layer (not shown) between the first electrode 310a and the active layer 330a and/or between the second electrode 320a and the active layer 330a. The auxiliary layer may be a charge auxiliary layer, an optical auxiliary layer, or any combination thereof, but is not limited thereto.

For example, the active layer 330b of the second optoelectronic diode 300b may be a light emitting layer. The active layer 330b of the second optoelectronic diode 300b may be configured to emit light of at least one of a blue wavelength spectrum, a green wavelength spectrum, a red wavelength spectrum, an infrared wavelength spectrum, or an ultraviolet wavelength spectrum. Herein the maximum emission wavelength ($\Delta_{max,E}$) of the blue wavelength spectrum, the green wavelength spectrum, the red wavelength spectrum, the infrared wavelength spectrum, and the ultraviolet wavelength spectrum may belong to each respective range of greater than or equal to about 380 nm and less than about 500 nm, about 500 nm to about 600 nm, greater than about 600 nm and less than or equal to about 700 nm, greater than about 700 nm and less than or equal to about 3000 nm, and less than about 380 nm.

The first semiconductor and the second semiconductor included in the active layer 330b may each independently be a host material or a dopant material. For example, the first semiconductor may be a host material and the second semiconductor may be a dopant material. For example, each of the first semiconductor and the second semiconductor may be a host material, and the active layer 330b may further include a dopant material. At least one of the first semiconductor or the second semiconductor may be a light emitting material, and for example, at least one of the first semiconductor or the second semiconductor may be an organic light emitting material. For example, at least one of the first semiconductor or the second semiconductor may be a polymeric light emitting material. For example, each of the first semiconductor and the second semiconductor may be a polymeric light emitting material, or one of the first semiconductor and the second semiconductor may be a polymeric light emitting material and the other may be a low molecular weight light emitting material. The first semiconductor and the second semiconductor may have the maximum emission wavelength ($\Delta_{max,E}$) in the same or different wavelength region.

The first semiconductor and the second semiconductor may be included in the active layer 330b in a weight ratio of about 1:9 to about 9:1, and within the above range, about 2:8 to about 8:2, and about 3:7 to about 7:3, about 4:6 to about 6:4, or about 5:5.

The elastomer included in the active layer 330b may be an insulating elastomer, and may be mixed with the first semiconductor and the second semiconductor in the active layer 330b. The elastomer may be mixed with the first semiconductor and the second semiconductor in the active layer 330b to impart stretchability to the active layer 330b, and may be distributed over the entire surface of the active layer 330b. For example, the elastomer may surround the first semiconductor and the second semiconductor in the active layer 330b, thereby preventing damage and/or cracking of the first semiconductor and the second semiconductor during stretching. A detailed description of the elastomer included in the active layer 330b is the same as the elastomer included in the active layer 330a.

The elastomer included in the active layer 330a and the elastomer included in the active layer 330b may be the same or different each other, and types and/or ratios of each aforementioned hard structural unit and soft structural unit may be adjusted, so that the first and second optoelectronic diodes 300a and 300b respectively may have desired elasticity.

For example, the active layer 330b may have a similar elastic modulus to that of the substrate 110, for example, the elastic modulus of the active layer 330a may be about 0.5 times to about 100 times the elastic modulus of the substrate 110 and within the above range, about 0.5 times to 80 times, about 0.5 times to about 60 times, about 0.5 times to about 50 times, or about 0.5 times to about 30 times, but is not limited thereto.

The elastic modulus of the active layer 330b may be, for example, about $10^2$ Pa to about $10^9$ Pa and within the above range, about $10^2$ Pa to about $10^8$ Pa, about $10^3$ Pa to about $10^7$ Pa, or about $10^4$ Pa to about $10^7$ Pa, but is not limited thereto.

The aforementioned example describes that the active layer 330a of the first optoelectronic diode 300a and the active layer 330b of the second optoelectronic diode 300b respectively include an elastomer, but the elastomer may be included in either one of the active layer 330a of the first optoelectronic diode 300a and the active layer 330b of the second optoelectronic diode 300b.

The second optoelectronic diode 300b may further include an auxiliary layer (not shown) between the first electrode 310b and the active layer 330b and/or between the second electrode 320b and the active layer 330b. The auxiliary layer may be a charge auxiliary layer, an optical auxiliary layer, or any combination thereof, but is not limited thereto.

The pixel defining layer 400 is formed on the entire surface of the substrate 110 and may define the first optoelectronic diode 300a and the second optoelectronic diode 300b. The pixel defining layer 400 includes a plurality of openings 410a and 410b respectively exposing the first optoelectronic diode 300a and the second optoelectronic diode 300b. The pixel defining layer 400 may be an insulation layer. The pixel defining layer 400 may be an insulation layer that may include an organic, inorganic, or organic-inorganic insulating material, in some example embodiments, an inorganic insulating material such as silicon oxide, silicon nitride, or silicon oxynitride; an organic insulating material such as polyimide, polyamide, polyamideimide or polyacrylate; or an organic-inorganic insulating material such as polyorganosiloxane or polyorganosilazane. The insulation layer of the pixel defining layer 400 may be a stretchable insulation layer and may include, in some example embodiments, the aforementioned elastomer that may be included in the optoelectronic diode(s) 300 according to any of the example embodiments.

The encapsulation layer 500 may cover the entire surface of the stretchable device 100 and prevent moisture and air from flowing into the stretchable device 100 to protect the optoelectronic diode 300. The encapsulation layer 500 may be, for example, a polymer thin film, for example, a stretchable polymer thin film. The encapsulation layer 500 may include an organic, inorganic, or organic-inorganic insulating material, in some example embodiments, an inorganic insulating material such as silicon oxide, silicon nitride, silicon oxynitride, aluminum oxide, aluminum nitride or aluminum oxynitride; an organic insulating material such as polyimide, polyamide, polyamideimide, polyethylene terephthalate, polyethylene naphthalate, polyethylene, polyethersulfone, polycarbonate or polyacrylate; or an organic-inorganic insulating material such as polyorganosiloxane or polyorganosilazane. The encapsulation layer 500 may be a stretchable insulation layer and may include, in some example embodiments, an elastomer. The elastomer may be the aforementioned elastomer that may be included in the optoelectronic diode(s) 300 according to any of the example embodiments. The encapsulation layer 500 may include, alone or in combination with the aforementioned elastomer, an oxide, a nitride, and/or an oxynitride, such as an oxide, a nitride, and/or an oxynitride including aluminum (Al), titanium (Ti), zirconium (Zr), hafnium (Hf), tantalum (Ta), silicon (Si), or a combination thereof.

The stretchable device 100 may further include connection wiring (not shown) connecting a neighboring optoelectronic diode 300. The connection wiring may, for example, electrically connect the neighboring optoelectronic diode 300. The connection wiring may be, for example, made of a low resistance conductor, for example, silver, gold, copper, aluminum, or an alloy thereof. The connection wiring may be, for example, a stretchable wiring.

As described above, the active layer 330 may include an elastomer in addition to the first semiconductor and the second semiconductor for implementing electrical characteristics to implement the stretchable optoelectronic diode 300. Accordingly, unlike a conventional stretchable device depending only on stretchability of the substrate 110, the optoelectronic diode 300 itself according to some example embodiments may be applied with stretchability (e.g., based on the active layer 330 including the elastomer in addition to the first semiconductor and the second semiconductor) to overcome a stretching limit of the stretchable device 100 and simultaneously to flexibly respond to an external force or external movement such as twisting, pressing, and pulling without breaking and/or damage and thus to prevent degradation of electrical characteristics due to stretching.

For example, the stretchable device 100 may have an elongation rate of greater than or equal to about 30% and within the above range, greater than or equal to about 40%, greater than or equal to about 50%, greater than or equal to about 60%, greater than or equal to about 70%, greater than or equal to about 80%, greater than or equal to about 90%, or greater than or equal to about 100%, about 30% to 1000%, for example, about 40% to about 1000%, about 50% to about 1000%, about 60% to about 1000%, about 70% to about 1000%, about 80% to 1000%, about 90% to 1000%, or about 100% to 1000%. Herein, the elongation rate may be a percentage of a length elongated to a breaking point relative to an initial length.

In addition, due to insulating characteristics and surface characteristics, the elastomer may increase miscibility without affecting electrical characteristics between first semiconductor and second semiconductor in the active layer 330, and structural units of the elastomer may be appropriately selected to realize the active layer 330 with a desired elastic modulus. Accordingly, in order to prevent damage of the optoelectronic diode 300 in a stretchable device such as a wearable device, another optoelectronic diode 300 may be formed on a rigid region to overcome possible stretchability limit of the optoelectronic diode 300 and thus realize a stretchable device with higher stretchability without damage.

Hereinafter, a stretchable device according to some example embodiments will be described.

Figure 3:
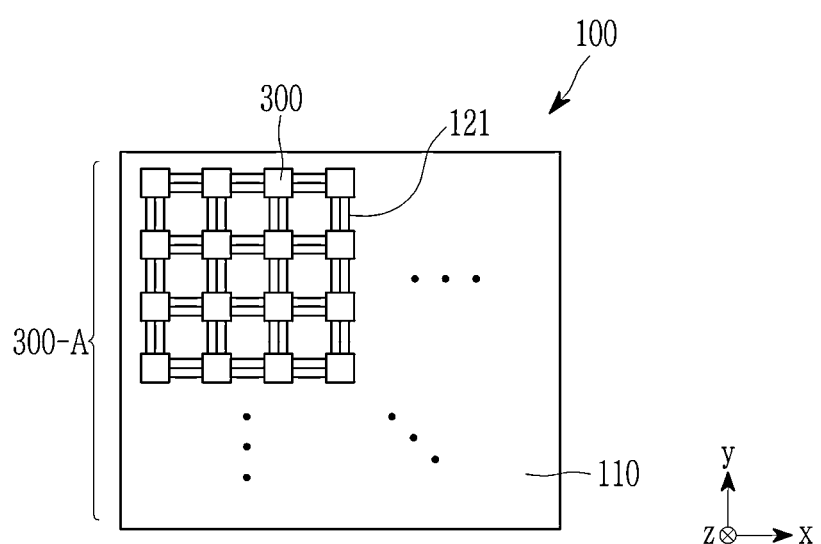
FIG. 3 is a plan view schematically showing a stretchable device according to some example embodiments.

FIG. 3 is a plan view schematically showing a stretchable device according to some example embodiments.

Referring to FIG. 3, the stretchable device 100 according to some example embodiments includes a substrate 110, and an optoelectronic diode array 300-A in which a plurality of optoelectronic diodes 300 are arranged along rows and/or columns on the substrate 110 along an in-plane direction of the substrate 110, such that the optoelectronic diodes 300 may form (e.g., establish, define, etc.) the optoelectronic diode array 300-A. In the optoelectronic diode array 300-A, a plurality of optoelectronic diodes 300 may be arranged in, for example, a Bayer matrix, a PenTile matrix, and/or a diamond matrix, but is not limited thereto.

It will be understood, as described herein, that an in-plane direction of the substrate 110 (e.g., x direction, y direction, or xy direction) may extend in parallel to an upper surface of the substrate 110 and thus may be referred to interchangeably as a direction extending in parallel to the upper surface of the substrate 110. Additionally, a direction extending perpendicular to the in-plane direction (e.g., the z direction, which extends perpendicular to the x direction, y direction, or xy direction) may be referred to interchangeably herein as a direction extending perpendicular to the upper surface of the substrate 110.

The plurality of optoelectronic diodes 300 constituting the optoelectronic diode array 300-A may include the first optoelectronic diode 300a and the second optoelectronic diode 300b, wherein some of the plurality of optoelectronic diodes 300 may be, for example, photosensors, and others of the plurality of optoelectronic diodes 300 may be, for example, light emitting diodes. Accordingly, the first optoelectronic diodes 300a (e.g., photosensors) and the second optoelectronic diodes 300b (e.g., light emitting diodes) may be arranged alternately or in blocks along a direction (e.g., xy direction) of the substrate 110. Description of each optoelectronic diode 300 is the same as described above.

In the drawing shown in FIG. 3, all the optoelectronic diodes 300 are illustrated to have the same size but not limited thereto, and at least one optoelectronic diode 300 may be larger or smaller than the other optoelectronic diodes 300. In the drawing shown in FIG. 3, all the optoelectronic diodes 300 have the same shape but are not limited thereto, and at least one optoelectronic diode 300 may have a different shape from those of the other optoelectronic diodes 300.

The stretchable device 100 may further include a pressure sensor (not shown). The pressure sensor may be between neighboring optoelectronic diodes 300 or instead of some of the arranged optoelectronic diode 300. The pressure sensor is a sensor configured to detect a change in pressure and may specify a location where a particular (or, alternatively, predetermined) pressure is applied in the stretchable device 100, and thus exclusively operate only the optoelectronic diode 300 located close to (e.g., closest to, adjacent to, etc.) that location.

The connection wiring 121 may be between the neighboring optoelectronic diodes 300 and may electrically connect the neighboring optoelectronic diodes 300. The connection wiring 121 may be one or more and arranged between the optoelectronic diodes 300 arranged along a row and/or a column in a row direction (e.g., x direction) and a column direction (e.g., y direction). The connection wiring 121 may be connected to a signal line (not shown), and the signal line may be, for example, a gate line transferring a gate signal (or a scan signal), a data line transferring a data signal, a driving voltage line applying a driving voltage, and/or a common voltage line applying a common voltage, but is not limited thereto. The connection wiring 121 may include, for example, a low resistance conductor, for example, silver, gold, copper, aluminum, or an alloy thereof.

The aforementioned stretchable device 100 may be applied to (e.g., included in) various electronic devices requiring stretchability, for example, a bendable display panel, a foldable display panel, a rollable display panel, a wearable device, and a skin-like display panel, a skin-like sensor, a large-area conformable display, smart clothing, etc., but the present inventive concepts is not limited thereto.

For example, the aforementioned stretchable device 100 may be included in a skin-like display panel.

Figure 4:
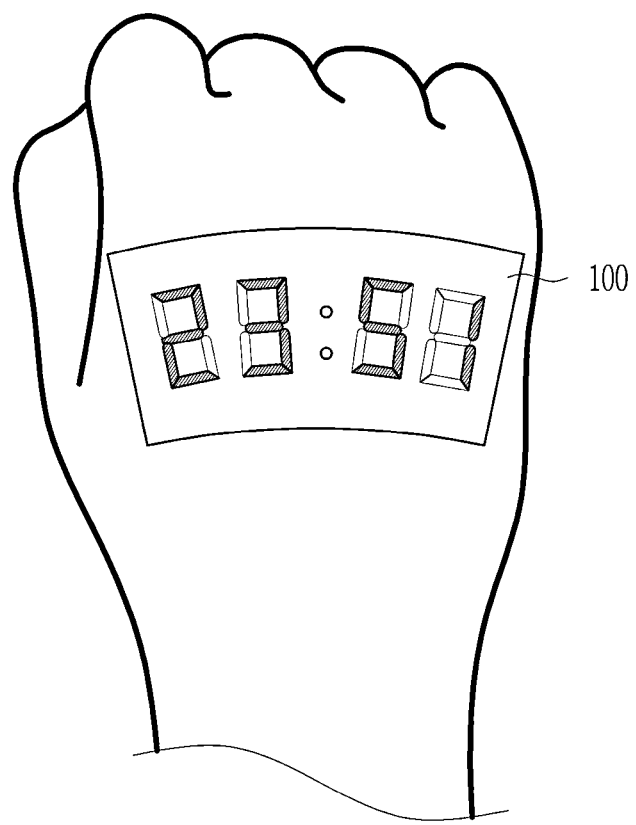
FIG. 4 is a schematic view showing an example of a skin-like display panel according to some example embodiments.
Figure 5A:
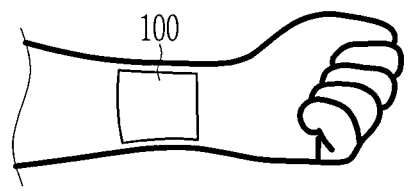
FIGS. 5A, 5B, 5C, and 6 are schematic views showing examples of biological sensors according to some example embodiments.
Figure 5B:
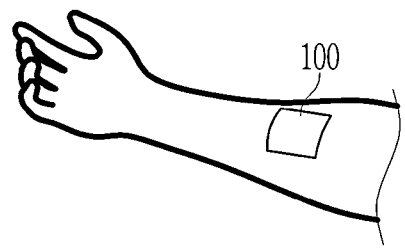
Figure 5C:
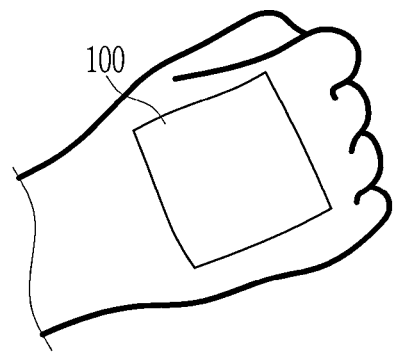

FIG. 4 is a schematic view showing an example of a skin-like display panel according to some example embodiments.

The stretchable device 100 may be a skin-like display panel, which is an ultrathin display panel, and may be attached to a part of a living body such as a hand. The skin-like display panel may display particular (or, alternatively, predetermined) information such as various letters and/or images.

For example, the aforementioned stretchable device 100 may be a bio signal sensor.

FIGS. 5A, 5B, 5C, and 6 are schematic views showing examples of biological sensors according to some example embodiments.

The stretchable device 100 may be an attachable biological sensor, and may be attached to a surface of a living body such as a skin, a living body such as an organ, or an indirect means for contacting a living body such as clothing to detect and measure biological information such as a biological signal. For example, the biological sensor includes an electroencephalogram (EGG) sensor, an electrocardiogram (ECG) sensor, a blood pressure (BP) sensor, an electromyography (EMG) sensor, a blood glucose (BG) sensor, a photoplethysmography (PPG) sensor, an accelerometer, a RFID antenna, an inertial sensor, an activity sensor, a strain sensor, a motion sensor, or a combination of these, but is not limited thereto. The biological sensor may be attached to a living body (e.g., wrist, back of hand, arm, chest, etc.) in a very thin patch-type or band-shaped form, so that the biological information may be monitored in real time.

Figure 6:
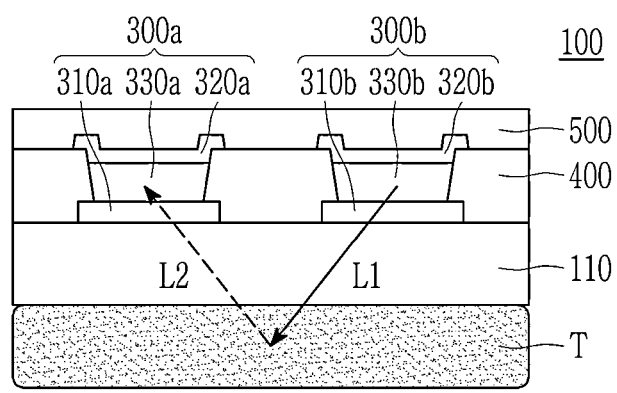

Referring to FIG. 6, the stretchable device 100, which is a bio signal sensor, may include the first optoelectronic diode 300a (e.g., a photosensor) and the second optoelectronic diode 300b (e.g., a light emitting diode). The second optoelectronic diode 300b may be configured to emit first light L1 for detecting bio signals. The second optoelectronic diode 300b may be, for example, an infrared light emitting diode configured to emit the first light L1 in the infrared wavelength spectrum or a visible light emitting diode configured to emit the first light L2 in the visible wavelength spectrum. The first light L1 emitted from first optoelectronic diode 300a may be reflected or absorbed by a target T (e.g., a living body such as skin or blood vessels).

The first optoelectronic diode 300a may receive the second light L2, which is the first light L1 emitted from the second optoelectronic diode 300b and reflected by the target T, and concert the second light L2 into electrical signals. The electrical signal converted from the second light L2 may include biometric information. The electrical signal including biometric information may be transferred to a sensor IC (not shown) or a processor (not shown).

For example, the stretchable device 100 may be a photoplethysmography sensor (PPG), and the biological information may include a heart rate, oxygen saturation, stress, arrhythmia, blood pressure, and the like, and may be obtained by analyzing waveforms of electric signals.

For example, the stretchable device 100 may be an electromyography (EMG) sensor or a strain sensor attached to a joint for rehabilitation treatment of patients with joint and muscle problems. The electromyography (EMG) sensor or the strain sensor may be attached to a desired site to quantitatively measure muscle movement or joint movement to secure data necessary for rehabilitation.

The aforementioned stretchable device, display panel, or bio signal sensor may be included in various electronic devices, and the electronic device may further include a processor (not shown) and a memory (not shown). The electronic device may be a mobile; TV; a health care device, and the like, and the health care device may be, for example, a photoplethysmography (PPG) sensor, an electroencephalogram (EEG) sensor, an electrocardiogram (ECG) sensor, a blood pressure (BP) sensor, an electromyography (EMG) sensor, a blood glucose (BG) sensor, an accelerometer device, a RFID antenna device, an inertial sensor, an activity sensor, a strain sensor, a motion sensor, or any combination thereof, but is not limited thereto.

While FIGS. 1, 2, and 6 illustrate a stretchable device 100 that includes multiple optoelectronic diodes 300a and 300b (e.g., a first optoelectronic diode 300a (e.g., a photosensor) and a second optoelectronic diode 300b (e.g., a light emitting diode), it will be understood that, in some example embodiments, the stretchable device 100 may include only one optoelectronic diode (e.g., one of optoelectronic diodes 300a or 300b) and may exclude other optoelectronic diodes.

In some example embodiments, the one optoelectronic diode 300 of the stretchable device 100 may be a photosensor (e.g., first optoelectronic diode 300a) according to any of the example embodiments, where the photosensor may be configured to sense incident light L2 that is emitted as light L1 from a light emitting device (e.g., a light emitting diode) that is external to the stretchable device 100 and is reflected from a target T to be sensed by the photosensor of the stretchable device 100 as light L2. In some example embodiments, the stretchable device 100 may include an array 300-A (shown in FIG. 3) of multiple optoelectronic diodes 300 that are only photosensors (e.g., an array 300-A of only photosensors) and which are configured to sense incident light that is emitted as light L1 from one or more light emitting devices (e.g., a light emitting diode) that is/are internal or external to the stretchable device 100 and is reflected from a target T to be sensed as light L2 by one or more photosensors of the array 300-A of the stretchable device 100.

In some example embodiments, the one optoelectronic diode 300 of the stretchable device 100 may be a light emitting diode (e.g., second optoelectronic diode 300b) according to any of the example embodiments, where the light emitting diode may be configured to emit light, as light L1, to be reflected from a target T to be sensed by one or more photosensors that are external to the stretchable device 100 as light L2. In some example embodiments, the stretchable device 100 may include an array 300-A (shown in FIG. 3) of multiple optoelectronic diodes 300 that are only light emitting diodes (e.g., an array 300-A of only light emitting diodes) and which are configured to emit light, as light L1, to be reflected from a target T to be sensed as light L2 by one or more photosensors that is/are internal or external to the stretchable device 100.

In some example embodiments, the stretchable device 100 may include multiple, separate arrays 300-A of optoelectronic diodes 300, where each separate array includes optoelectronic diodes 300 that are exclusively photosensors or optoelectronic diodes 300 that are exclusively light emitting diodes. For example, the stretchable device 100 may include two separate first and second arrays 300-A of optoelectronic diodes 300, where the first array 300-A includes an array of optoelectronic diodes 300 that are exclusively photosensors (e.g., the first array 300-A does not include any light emitting diodes included therein or interposed between photosensors thereof) while the second array 300-B includes a separate array of optoelectronic diodes 300 that are exclusively light emitting diodes (e.g., the second array 300-A does not include any photosensors included therein or interposed between light emitting diodes thereof), and where the first and second arrays may be spaced apart by a distance that is larger, equal to, or smaller than the interval distance between respective optoelectronic diodes within the respective arrays 300-A.

Figure 7:
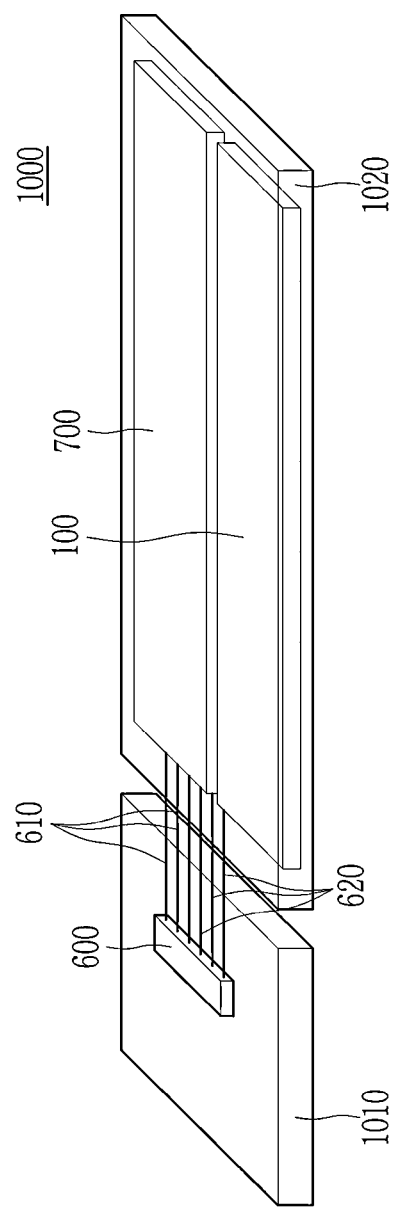
FIG. 7 is a schematic view illustrating an example of an electronic device, such as a health care device, according to some example embodiments.

FIG. 7 is a schematic view illustrating an example of an electronic device, such as a health care device, according to some example embodiments.

Referring to FIG. 7, the electronic device 1000, which may be a health care device according to some example embodiments, may be a patch-type or band-type attachable heath care device and include the aforementioned stretchable device 100; an IC sensor and/or a processor 600 for processing biometric signals obtained from the stretchable device 100, and a display area 700 (e.g., a light emitting diode (LED) display screen, an organic LED (OLED) display screen, etc.) displaying the obtained biometric signals into various letters and/or images.

As shown, the IC and/or processor 600 may be electrically coupled to the aforementioned stretchable device 100 and the display area 700 via separate, respective conductive lines 610, 620. In some example embodiments, the conductive lines 610, 620 may be conductive wires, conductive traces, an electrical bus, any combination thereof, or the like.

As shown, the IC and/or processor 600 may be on or at least partially embedded in a substrate 1010. The stretchable device 100, and the display area 700 may be on or at least partially embedded in a substrate 1020. In some example embodiments, substrate 1010 and 1020 may be separate portions of a single, continuous substrate that is a single piece of material. In some example embodiments, the substrate 1010 and 1020 may each at least partially comprise a same material as a material included in at least a portion of the substrate 110 as described herein. In some example embodiments at least the substrate 1020 comprises the substrate 110, such that the substrate 1020 is a single piece of material having a portion thereof that is the substrate 110 of a stretchable device 100.

The display area 700 may be a display panel, including an LED display panel, an OLED display panel, a liquid crystal display (LCD) panel, any combination thereof, or the like. The IC and/or processor 600 may be configured to display information on the display area 700 based on information obtains from stretchable device 100.

The IC and/or processor 600, and/or any portions thereof, may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, electronic devices, blocks, modules, units, controllers, circuits, and/or portions thereof according to any of the example embodiments, and/or any portions thereof.

Figure 8:
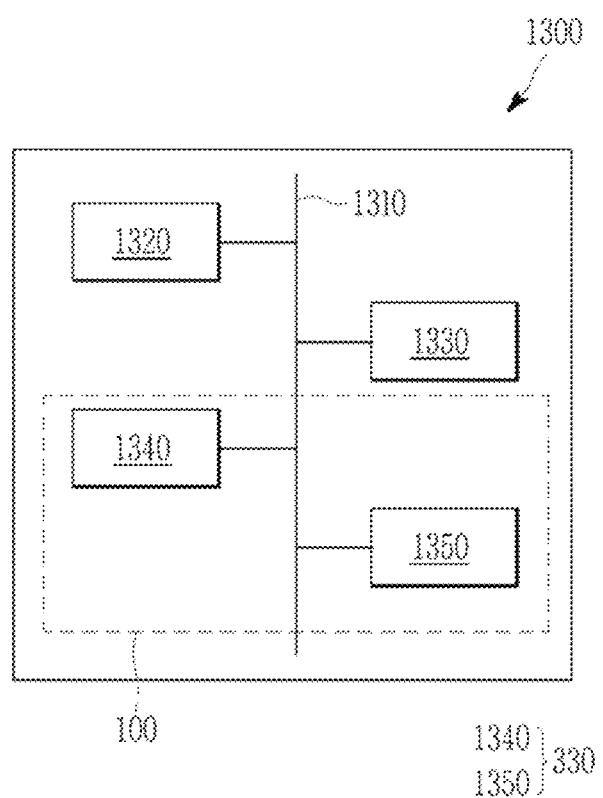
FIG. 8 is a schematic diagram of an electronic device according to some example embodiments.

FIG. 8 is a schematic diagram of an electronic device 1300 according to some example embodiments. The electronic device 1300 shown in FIG. 8 may be an electronic device according to any of the example embodiments.

Referring to FIG. 8, an electronic device 1300 includes a processor 1320, a memory 1330, a sensor 1340, and a display device 1350 electrically connected through a bus 1310. The sensor 1340 may include any of the photosensors according to any of the example embodiments. The display device 1350 may be any of the display panels, display areas, light emitting diodes, or the like according to any of the example embodiments. In the example embodiments shown in FIG. 8, the electronic device 1300 may include both a sensor 1340 and a display device 1350, but example embodiments are not limited thereto: in some example embodiments the electronic device 1300 may include one of the sensor 1340 or the display device 1350.

In some example embodiments, some or all of the electronic device 1300 may include or be included in a stretchable device according to any of the example embodiments. For example, in some example embodiments, the electronic device 1300 may include a stretchable device 100 according to any of the example embodiments that includes at least one of the sensor 1340 (e.g., one or more photosensor optoelectronic diodes according to any of the example embodiments) or the display device 1350 (e.g., one or more light emitting diode optoelectronic diodes according to any of the example embodiments). Such a stretchable device 100 may include an array 300-A of optoelectronic diodes 300 that comprise at least one of the sensor 1340 or the display device 1350 as shown in FIG. 8, and the memory 1330, processor 1320, and bus 1310 may be on the substrate 110 of the stretchable device 100 and coupled to the unit device array 300-A of the stretchable device 100 (e.g., via one or more articles of connection wiring 121). In some example embodiments, the stretchable device 100 may be limited to the sensor 1340 and/or display device 1350 included in the electronic device 1300, wherein the memory 1330 and processor 1320 are external to the stretchable device 100 and coupled thereto (e.g., via bus 1310) to establish the electronic device 1300.

The processor 1320 may perform a memory program and thus at least one function, including controlling the sensor 1340 and/or displaying an image on the display device 1350. The processor 1320 may generate an output.

As described herein, any devices, systems, electronic devices, blocks, modules, units, controllers, circuits, and/or portions thereof according to any of the example embodiments, and/or any portions thereof (including, without limitation, stretchable device 100, electronic device 1000, IC sensor and/or processor 600, display area 700, electronic device 1300, processor 1320, memory 1330, sensor 1340, display device 1350, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, electronic devices, blocks, modules, units, controllers, circuits, and/or portions thereof according to any of the example embodiments, and/or any portions thereof.

Any of the memories and/or storage devices described herein, including, without limitation, memory 1330, or the like, may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Hereinafter, some example embodiments are illustrated in more detail with reference to examples. However, the scope of the inventive concepts is not limited to these examples.

PREPARATION EXAMPLES

Preparation Example 1

The following polymer A (p-type semiconductor, Mw=40,000 g/mol to 50,000 g/mol, surface tension: 26.1 mJ/m$^2$) (1-Material Inc.), the following polymer B (n-type semiconductor, Mw=60,000 g/mol to 70,000 g/mol, surface tension: 25.8 mJ/m$^2$) (eFlexPV Ltd.), and styrene-ethylene-butylene-styrene (SEBS) including a styrene structural unit and an ethylene/butylene structural unit in a ratio of 12:88 (w/w) (surface tension: 28.6 mJ/m$^2$) (H1122, Asahi Kasei Corp.) in a weight ratio of 1.3:1.0:1.15 are blended in chloroform and then, stirred at 40° C. for 12 hours, preparing an organic semiconductor solution for an active layer.

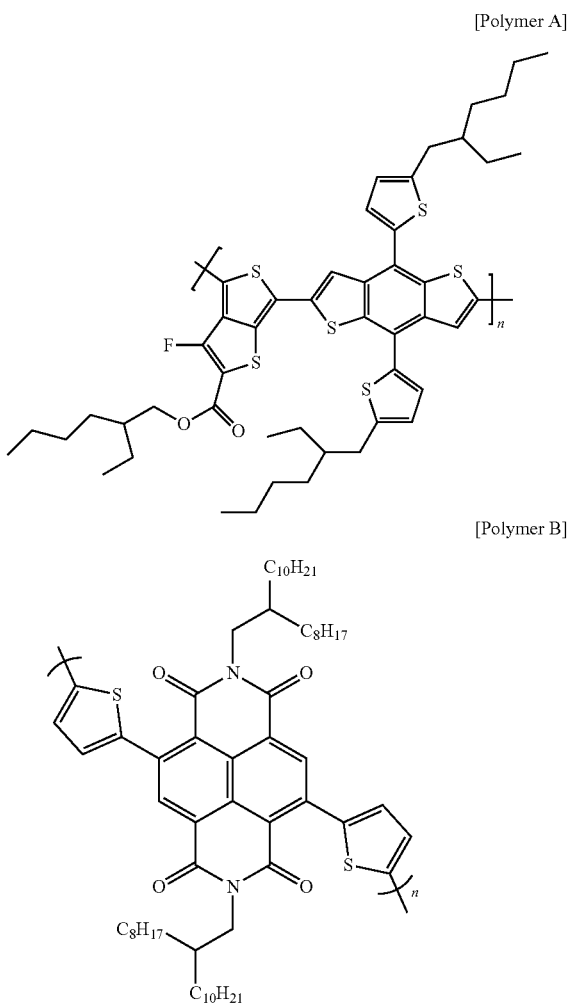

[Polymer A]

[Polymer B]

Preparation Example 2

An organic semiconductor solution for an active layer is prepared according to the same method as Preparation Example 1 except that the polymer A, the polymer B, and SEBS are used in a weight ratio of 1.3:1.0:2.3.

Preparation Example 3

An organic semiconductor solution for an active layer is prepared according to the same method as Preparation Example 1 except that the polymer A, the polymer B, and SEBS are used in a weight ratio of 1.3:1.0:3.5.

Comparative Preparation Example 1

An organic semiconductor solution for an active layer is prepared according to the same method as Preparation Example 1 except that the polymer A and the polymer B are used in a weight ratio of 1.3:1 without SEBS.

Preparation Example 4

An organic semiconductor solution for an active layer is prepared according to the same method as Preparation Example 1 except that phenyl-C61-butyric acid methyl ester (PCBM) (surface tension: 42.3 mJ/m$^2$) is included instead of the polymer B as an n-type semiconductor, and the polymer A, PCBM, and SEBS in a weight ratio of 1.3:1.0:1.15 are blended in chlorobenzene and then, stirred at 80° C. for 12 hours.

Preparation Example 5

An organic semiconductor solution for an active layer is prepared according to the same method as Preparation Example 4 except that the polymer A, PCBM, and SEBS are used in a weight ratio of 1:1.5:2.5.

Comparative Preparation Example 2

An organic semiconductor solution for an active layer is prepared according to the same method as Preparation Example 4 except that the polymer A and PCBM are used in weight ratio of 1:1.5 without SEBS.

Manufacture of Stretchable Device

Example 1

On a glass substrate coated with a sacrificial layer, a solution prepared by dissolving styrene-ethylene-butylene-styrene (SEBS) including a styrene structural unit and an ethylene/butylene structural unit in a ratio of 20:80 (w/w) (Tg=60° C., H1052, Asahi Kasei Corp.) and a photocuring agent (bis(6-((4-azido-2,3,5,6-tetrafluorobenzoyl)oxy)hexyl)decanedioate) in toluene is coated, dried, cured, and patterned to form a 5 μm-thick stretchable substrate (elongation rate: about 700%, elastic modulus: about ~1 MPa). Subsequently, a conductive polymer solution is coated on the stretchable substrate and patterned to form a lower stretchable electrode (e.g., poly(3,4-ethylenedioxythiophene) (PEDOT), poly(3,4-ethylenedioxythiophene) polystyrene sulfonate (PEDOT:PSS), or the like). On the lower stretchable electrode, the organic semiconductor solution for an active layer according to Preparation Example 1 is spin-coated and vacuum-dried to form a 0.5 μm-thick active layer. On the active layer, a conductive polymer solution is coated and patterned to form an upper stretchable electrode, manufacturing a stretchable device. Lastly, the sacrificial layer is dissolved to separate the stretchable device from the glass substrate.

Example 2

A stretchable device is manufactured according to the same method as Example 1 except that the organic semiconductor solution for an active layer according to Preparation Example 2 is used instead of the organic semiconductor solution for an active layer according to Preparation Example 1 to form an active layer.

Example 3

A stretchable device is manufactured according to the same method as Example 1 except that the organic semiconductor solution for an active layer according to Preparation Example 3 is used instead of the organic semiconductor solution for an active layer according to Preparation Example 1 to form an active layer.

Comparative Example 1

A stretchable device is manufactured according to the same method as Example 1 except that the organic semiconductor solution for an active layer according to Comparative Preparation Example 1 is used instead of the organic semiconductor solution for an active layer according to Preparation Example 1 to form an active layer.

Example 4

A stretchable device is manufactured according to the same method as Example 1 except that the organic semiconductor solution for an active layer according to Preparation Example 4 is used instead of the organic semiconductor solution for an active layer according to Preparation Example 1 to form the active layer.

Example 5

A stretchable device is manufactured according to the same method as Example 1 except that the organic semiconductor solution for an active layer according to Preparation Example 5 is used instead of the organic semiconductor solution for an active layer according to Preparation Example 1 to form the active layer.

Comparative Example 2

A stretchable device is manufactured according to the same method as Example 1 except that the organic semiconductor solution for an active layer according to Comparative Preparation Example 2 is used instead of the organic semiconductor solution for an active layer according to Preparation Example 1 to form the active layer.

Evaluation I

Electrical characteristics of stretchable devices according to Examples and Comparative Examples are evaluated.

A dark current is evaluated by using a current-voltage evaluation equipment (Keithley K4200 Parameter Analyzer) and divided by a unit pixel area (0.04 cm$^2$) to obtain dark current density, and the dark current density is evaluated from a current flowing when a reverse bias of −1 V is applied.

Detectivity is evaluated by dividing a dose of incident light by a photocurrent and dividing it again by the dark current, which is noise.

The results are shown in Tables 1 and 2.

TABLE 1

| | Detectivity (Jones, @1 V) | | Dark Current |
|---|---|---|---|
| | 550 nm | 650 nm | (A/cm$^2$) |
| Example 1 | 4.61E+12 | 6.63E+12 | 2.94E−9 |
| Example 2 | 1.56E+13 | 2.40E+13 | 1.52E−10 |
| Example 3 | 9.67E+12 | 9.42E+12 | 1.83E−10 |
| Comparative Example 1 | 1.17E+12 | 1.86E+12 | 7.46E−8 |

TABLE 2

|  | Detectivity (Jones, @1 V) | | Dark Current |
| --- | --- | --- | --- |
|  | 550 nm | 650 nm | (A/cm$^2$) |
| Example 4 | 1.20E+13 | 1.50E+13 | 8.40E−10 |
| Example 5 | 1.10E+13 | 1.40E+13 | 3.50E−10 |
| Comparative Example 2 | 4.40E+12 | 5.40E+12 | 1.10E−8 |

Referring to Tables 1 and 2, the stretchable devices according to the Examples 1-5 exhibit improved dark current and detectivity, compared with the stretchable devices according to Comparative Examples 1-2.

Evaluation II

The mechanical properties of the stretchable devices according to Examples and Comparative Examples are evaluated.

The mechanical properties are evaluated from an elastic modulus of the active layers of the stretchable devices and an elongation rate (Crack on set, COS) at time when microcracks with a size of several micrometers are observed under an optical microscope, when stretchable devices are stretched in both directions (e.g., x direction).

The results are shown in Tables 3 and 4.

TABLE 3

|  | Elastic modulus (Mpa) | COS (%) |
| --- | --- | --- |
| Example 1 | 12.18 | 75 |
| Example 2 | 4.68 | 100 |
| Comparative Example 1 | 338.89 | 30 |

TABLE 4

|  | COS (%) |
| --- | --- |
| Example 4 | 15 |
| Example 5 | 30 |
| Comparative Example 2 | 5 |

Referring to Tables 3 and 4, the stretchable devices according to Examples exhibit high flexibility and improved mechanical properties, compared with the stretchable devices according to Comparative Examples.

Accordingly, the stretchable devices according to Examples exhibit improved electrical characteristics and high mechanical durability against elongation, compared with the stretchable devices according to Comparative Examples.

While this inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A stretchable device, comprising:
a stretchable substrate; and
a plurality of optoelectronic diodes on the stretchable substrate,
wherein each optoelectronic diode includes,
an anode and a cathode, and
an active layer between the anode and the cathode, the active layer including
a first semiconductor,
a second semiconductor having different electrical characteristics from the first semiconductor, and
an insulating elastomer, the insulating elastomer being a copolymer, the copolymer including at least one first structural unit and at least one second structural unit different from the first structural unit,
wherein the first structural unit includes a styrene structural unit, an olefin structural unit, a urethane structural unit, an ether structural unit, or any combination thereof,
wherein the second structural unit includes an ethylene structural unit, a propylene structural unit, a butylene structural unit, an isobutylene structural unit, a butadiene structural unit, an isoprene structural unit, or any combination thereof, and
wherein a weight ratio of the first structural unit to the second structural unit is about 0.01 to about 0.5.

2. The stretchable device of claim 1, wherein at least one of the first semiconductor or the second semiconductor is an organic semiconductor.

3. The stretchable device of claim 1, wherein at least one of the first semiconductor or the second semiconductor is a polymeric semiconductor.

4. The stretchable device of claim 1, wherein the insulating elastomer comprises styrene-ethylene-butylene-styrene (SEBS), styrene-ethylene-propylene-styrene (SEPS), styrene-butadiene-styrene (SBS), styrene-isobutylene-styrene (SIBS), or any combination thereof.

5. The stretchable device of claim 1, wherein the insulating elastomer is included in the active layer in an amount that is greater than or equal to an amount of the first semiconductor or the second semiconductor in the active layer.

6. The stretchable device of claim 1, wherein the insulating elastomer is included in the active layer in an amount of about 30 wt % to about 75 wt % based on a total content of the first semiconductor, the second semiconductor, and the insulating elastomer in the active layer.

7. The stretchable device of claim 1, wherein the active layer comprises a mixture of the first semiconductor, the second semiconductor, and the insulating elastomer.

8. The stretchable device of claim 1, wherein the anode or the cathode is a stretchable electrode.

9. The stretchable device of claim 1, further comprising:
a connection wiring electrically connecting adjacent optoelectronic diodes of the plurality of optoelectronic diodes,
wherein the connection wiring comprises a stretchable wiring.

10. The stretchable device of claim 1, wherein
at least one first optoelectronic diode of the plurality of optoelectronic diodes includes a photosensor configured to absorb light and convert the absorbed light into an electrical signal, and
the active layer of the at least one first optoelectronic diode is a photoelectric conversion layer.

11. The stretchable device of claim 10, wherein each semiconductor of the first semiconductor and the second semiconductor in the photoelectric conversion layer is a p-type semiconductor or an n-type semiconductor.

12. The stretchable device of claim 10, wherein
at least one second optoelectronic diode of the plurality of optoelectronic diodes is a light emitting diode that is configured to emit light, and
the active layer of the at least one second optoelectronic diode is a light emitting layer.

13. The stretchable device of claim 12, wherein each semiconductor of the first semiconductor and the second semiconductor in the light emitting layer is a host material or a dopant material.

14. The stretchable device of claim 1, wherein
the plurality of optoelectronic diodes includes a plurality of first optoelectronic diodes and a plurality of second optoelectronic diodes,
the plurality of first optoelectronic diodes are photosensors that are each configured to absorb light and convert the absorbed light into an electrical signal,
the plurality of second optoelectronic diodes are light emitting diodes that are each configured to emit light, and
the photosensors and the light emitting diodes are arranged along an in-plane direction of the stretchable substrate to establish an array of optoelectronic diodes.

15. The stretchable device of claim 1, wherein the stretchable device is a bio signal sensor.

16. The stretchable device of claim 1, wherein the stretchable device is a display panel.

17. A stretchable device, comprising:
a stretchable substrate; and
an optoelectronic diode on the stretchable substrate, the optoelectronic diode including
an anode and a cathode, and
an active layer between the anode and the cathode, the active layer including
a first semiconductor,
a second semiconductor having different electrical characteristics from the first semiconductor, and
an insulating elastomer.

18. The stretchable device of claim 17, wherein the optoelectronic diode is a photosensor or a light emitting diode.

19. The stretchable device of claim 17, further comprising:
a first array of optoelectronic diodes that are arranged along an in-plane direction of the stretchable substrate, the first array of optoelectronic diodes including the optoelectronic diodes,
wherein the first array of optoelectronic diodes are exclusively photosensors or light emitting diodes.

20. The stretchable device of claim 19, further comprising:
a second array of optoelectronic diodes that are arranged along the in-plane direction of the stretchable substrate,
wherein the first array of optoelectronic diodes are exclusively photosensors and the second array of optoelectronic diodes are exclusively light emitting diodes.

21. The stretchable device of claim 17, wherein the first semiconductor, the second semiconductor, and the insulating elastomer are included in the active layer in a weight ratio of 1.3:1.0:1.15 to 1.3:1.0:3.5.

* * * * *